United States Patent
Oppelt

(10) Patent No.: US 7,432,764 B2
(45) Date of Patent: Oct. 7, 2008

(54) PUSH-PULL AMPLIFIER WITH TRANSFORMATIONAL NEGATIVE FEEDBACK

(75) Inventor: Ralph Oppelt, Uttenreuth (DE)

(73) Assignee: Seimens Aktiengesellschaft, Munich (DE)

( * ) Notice: Subject to any disclaimer, the term of this patent is extended or adjusted under 35 U.S.C. 154(b) by 119 days.

(21) Appl. No.: 11/502,846

(22) Filed: Aug. 11, 2006

(65) Prior Publication Data

US 2007/0040612 A1 Feb. 22, 2007

(30) Foreign Application Priority Data

Aug. 12, 2005 (DE) .................. 10 2005 038 442

(51) Int. Cl.
*H03F 3/26* (2006.01)
(52) U.S. Cl. ........................ 330/265; 330/79
(58) Field of Classification Search .................. 330/265, 330/79, 82, 271, 296
See application file for complete search history.

(56) References Cited

U.S. PATENT DOCUMENTS 3,417,339 A * 12/1968 Sondermeyer ............... 330/271
3,778,730 A * 12/1973 Cromwell et al. ........... 331/109
6,751,495 B2 * 6/2004 Maier et al. ................. 600/410

FOREIGN PATENT DOCUMENTS

DE  693 15 528 T2  6/1994
EP  0 591 032 A1  6/1994

OTHER PUBLICATIONS

J. v. Parpart, "Breitbandige Ferrti-Hochfrequenztransformatoren", Hüthig Verlag 1997, p. 122-126.
J. v. Parpart, "Breitbandige Ferrti-Hochfrequenztransformatoren", Hüthig Verlag 1997, p. 131-133.

* cited by examiner

*Primary Examiner*—Robert J. Pascal
*Assistant Examiner*—Alan Wong
(74) *Attorney, Agent, or Firm*—Schiff Hardin LLP

(57) ABSTRACT

The push-pull amplifier with transformational negative feedback is provided for amplification of variable electrical signals. It includes a signal input and a signal output, a transformational negative feedback connected with the signal input and the signal output and an amplifier circuit. The amplifier circuit includes an input and an output as well as a first transistor and a second transistor. The input of the amplifier circuit is thereby connected with the signal input and the output of the amplifier circuit is thereby connected with the signal output via the transformational negative feedback.

16 Claims, 2 Drawing Sheets

PUSH-PULL AMPLIFIER WITH TRANSFORMATIONAL NEGATIVE FEEDBACK

BACKGROUND OF THE INVENTION

1. Field of the Invention

The present invention concerns a push-pull amplifier with transformational negative feedback for amplification of variable electrical signals

2. Description of the Related Art

Amplifier circuits with bipolar transistors are generally used for amplification of variable electrical signals. Depending on the circuit, the transistors thereby serve as controlled current or voltage sources that, however, are adapted or biased neither on the input side nor on the output side. In order to be able to use such an amplifier circuit in an amplifier. for RF (radio-frequency) signals of a relatively large bandwidth of, for example, 15 MHz to 300 MHz, the biasing must be extended in a suitable manner. Such RF signals are, for example, used in MR (magnetic resonance) imaging systems, in particular in medical imaging (for example nuclear magnetic resonance tomography). The extension of the amplifier circuit can in particular ensue with negative feedback means with which the input impedance and the output impedance of the amplifier can be adapted such that the impedance of the circuit connected at the amplifier input is at the same level as the amplifier input impedance or at a predetermined scaled level, for example. In the ideal, case the negative feedback even determines the amplification, such that the amplifier operates independent of the exemplar scattering of the employed transistors. This provides a more constant amplification factor of the amplifier across the entire bandwidth, whereby non-linear distortions that are in particular fed back to the transistor are kept low.

Such an amplifier in an emitter circuit with transformational negative feedback is described in "Breitbandige Ferrit-Hochfrequenztransformatoren" (J. v. Parpart, Hüthig Verlag 1997, p. 122-126). The transformational negative feedback is thereby effected by means of a directional coupling transformer. The emitter circuit is connected with an npn transistor such that this operates in single-phase A operation. However, a very high quiescent current is required for this for low-distortion amplification Furthermore, a push-pull amplifier with transformational negative feedback is described in "Breitbandige Ferrit-Hochfrequenztransformatoren" (J. v. Parpart, Hüthig Verlag 1997, p. 130-133). The aforementioned emitter circuits with transformational negative feedback are thereby symmetrically extended by this same emitter circuit with transformational negative feedback. The signal input and the signal output are thereby respectively connected (via a balancing means in the form of a transformer with a one-sided central tap) with both symmetrically-arranged emitter circuits with transformational negative feedback. In comparison to the aforementioned amplifier type, this amplifier type has the advantage that it exhibits a significantly lower distortion given a lower current consumption. However, due to the use of four radio-frequency transformers in the amplifier, the amplifier has a high technical cost. For example, when the amplifier is used as a component of a radio-frequency circuit each radio-frequency transformer entails inherent disadvantages such as, for example, limited bandwidth, high losses and large space requirements, which must be compensated for in the realization of an amplifier.

SUMMARY OF THE INVENTION

The present invention provides a push-pull amplifier with transformational negative feedback that may be provided at a lower technological cost relative to the prior art amplifiers.

More specifically, the present push-pull amplifier with transformational negative feedback for amplification of variable electrical signals, includes a signal input and a signal output, a transformational negative feedback means connected with the signal input and the signal output and an amplifier circuit comprising an input and an output as well as a first transistor and a second transistor, whereby the input of the amplifier circuit is connected with the signal input and the output of the amplifier circuit is connected with the signal output via the transformational negative feedback means. The amplifier is executed as a push-pull circuit constructed from two suitable transistors and these are connected with the signal input and signal output via only one transformational negative feedback means, the advantages connected with this are in particular to be seen in a reduction of the number of transformers connected in the measurement parameter.

It is in particular advantageous that the transformational negative feedback means is designed as a directional coupler transformer which comprises an input transformer and an output transformer with respective primary and secondary coils. The input of the amplifier circuit is thereby connected with the signal input via the primary coil of the input transformer and with a reference potential (in particular a ground potential) via the secondary coil of the output transformer, at least for the variable electrical signal to be amplified. Furthermore, the output of the amplifier circuit is connected with the signal output via the primary coil and with the reference potential (in particular a ground potential) via the secondary coil of the input transformer, at least for the variable electrical signal to be amplified. By means of such a negative feedback network the input impedance of the amplifier circuit of the amplifier circuit is identical or scaled identically with the impedance connected at the output.

BRIEF DESCRIPTION OF THE DRAWINGS

Preferred but in no way limiting exemplary embodiments of the device are now explained in detail with reference to the drawings. For illustration, the drawings are executed as circuit diagrams, and certain features are schematically represented.

DETAILED DESCRIPTION OF THE PREFERRED EMBODIMENTS

Figure 1:
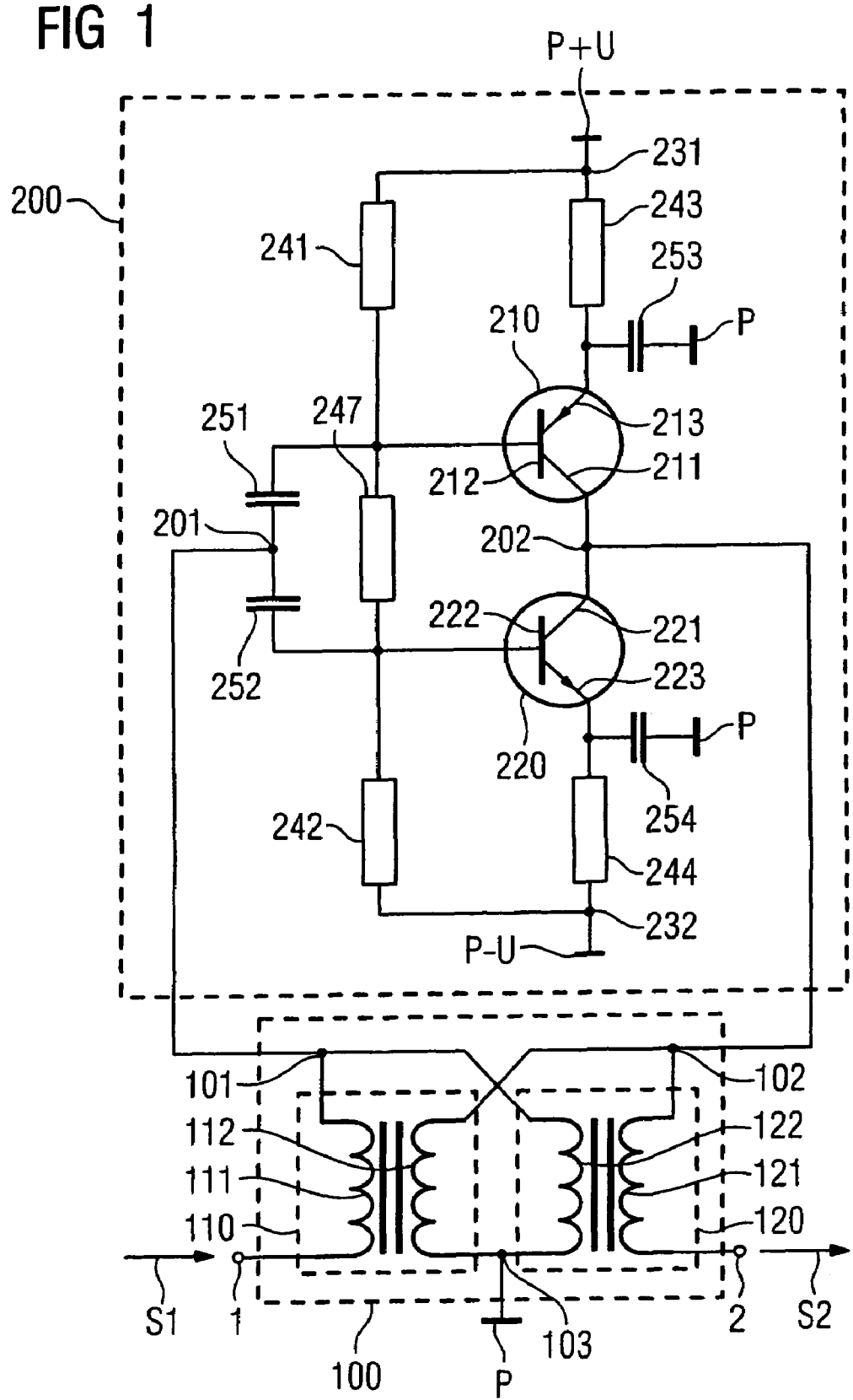
FIG. 1 is a circuit diagram of a push-pull amplifier with alternating voltage negative feedback according to principles of the present invention.
Figure 2:
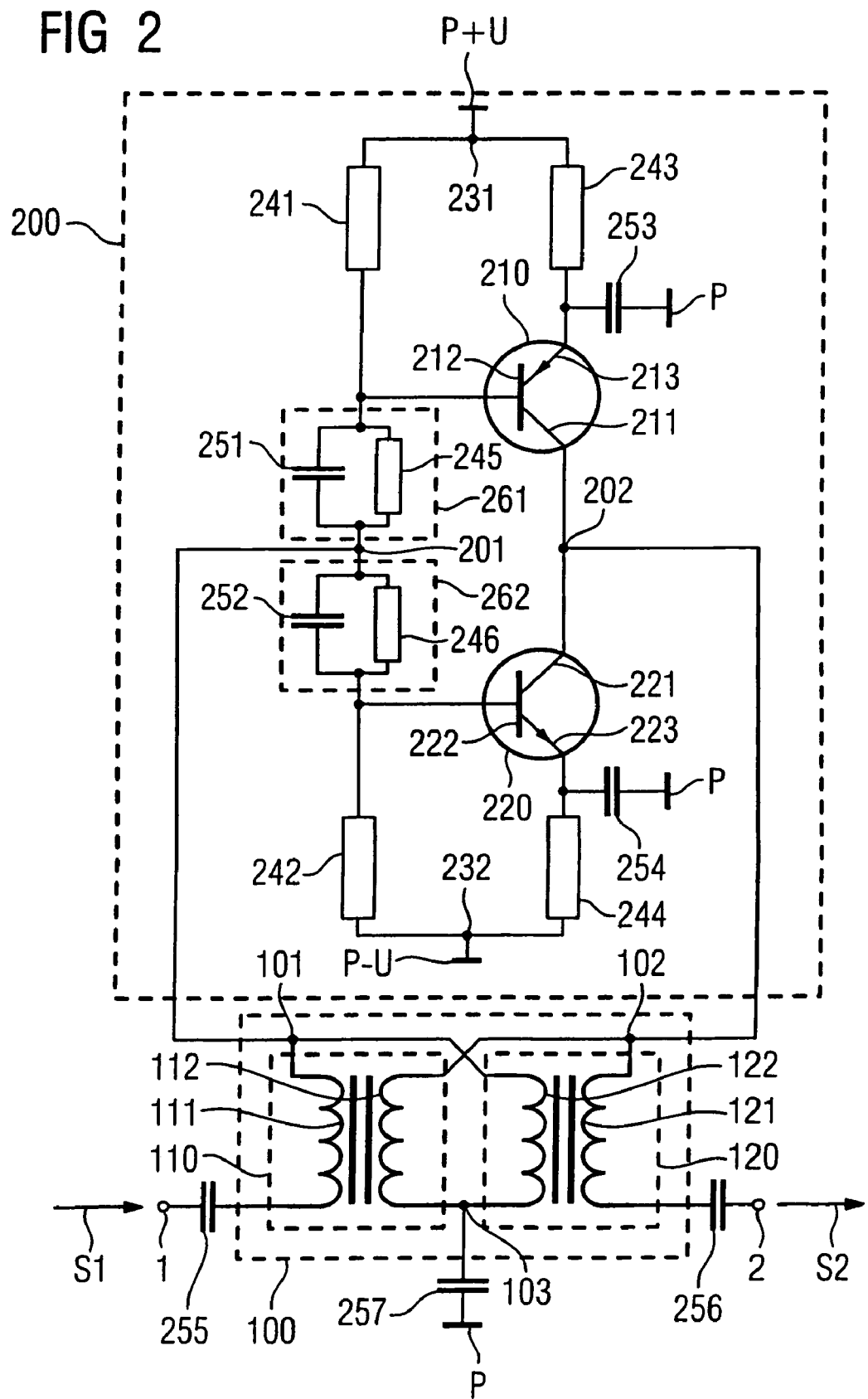
FIG. 2 is a circuit diagram of a push-pull amplifier with alternating voltage negative feedback and direct voltage negative feedback of an alternative embodiment.

Parts corresponding to one another are provided with the same reference characters in FIGS. 1 and 2.

A push-pull amplifier with alternating voltage negative feedback is shown in FIG. 1. The push-pull amplifier thereby comprises a signal input 1, a signal output 2, a transformational negative feedback 100 and an amplifier circuit 200. The signal input 1 and the signal output 2 are connected with the amplifier circuit 200 via the transformational negative feedback 100 (which in the preferred embodiment is a directional coupler transformer).

The directional coupler transformer 100 is fashioned from an input transformer 110 with a primary coil 111 and a secondary coil 112 and from an output transformer 120 with a primary coil 121 and a secondary coil 122, whereby the input transformer 120 and the output transformer 120 are connected with one another in a suitable manner. The primary coil 111 of the input transformer 110 is thereby connected with the secondary coil 122 of the output transformer 120 via a node point 101 and the primary coil 121 of the output transformer 120 is thereby connected with the secondary coil 112 of the input transformer 110 via a further node point 102. The secondary coils 112 and 122 are additionally connected with one another at their other ends via a third node point 103 that corresponds to a reference potential P, in particular a ground potential. The signal input 1 into which a variable electrical signal S1 (in particular a radio-frequency signal in the frequency range from 10 kHz to 10 GHz) is to be fed is connected with the primary coil 111 of the input transformer 110 and thus via this with the node point 101. In contrast to this, the signal output 2 that supplies the input signal S1 amplified by the push-pull amplifier as an output signal S2 is connected with the primary coil 121 of the output transformer 120 and thus via this with the node point 102.

The connection of the amplifier circuit 200 with the directional coupler transformer 100 ensues via an input 201 and an output 202 of the amplifier circuit, in that the input 201 is connected at the node point 101 and the output 202 is connected at the node point 102. The amplifier circuit 200 comprises a first transistor 210 and a second transistor 220, whereby both transistors 210, 220 are in particular provided as a complementary pnp and npn transistor pair 210, 220. Due to the space savings and better thermal coupling, the transistor pair 210, 220 is advantageously fashioned as an integrated component. The transistors 210, 220 respectively comprise a collector 211, 221, a base 212, 222 and an emitter 213, 223. The collectors 211, 221 are thereby mutually connected with one another at the output 202 and the bases 212, 222 are respectively connected via a capacitor 251, 252 at the input 201 of the amplifier circuit 200.

Two voltage supply connections 231 and 232 that are to be charged with direct voltages +U and −U that are symmetrical around the reference potential P are provided for voltage supply of the amplifier circuit 200. For example, if the reference potential P is equal to the ground potential and thus is 0 V, +5 V is typically present at the voltage supply connection 231 and −5 V is typically present at the voltage supply connection 232.

The base 212 and the emitter 213 of the pnp transistor 210 are respectively connected to the voltage supply connection 231 via correspondingly-associated resistors 241 and 243. Symmetrical to this, the base 222 and the emitter 223 of the npn transistor 220 are respectively connected at the second voltage supply connection 232 via correspondingly-associated resistors 242 and 244. Both bases 212 and 222 are additionally connected with one another via a further resistor 247. The resistors 241, 247 and 242 thus form a voltage divider for the voltage difference 2·U between the voltage supply connections 231 and 232 and thereby determine the voltages present at the bases 212 and 222. The quiescent currents in the transistors 210 and 220 given present emitter resistors 243 and 244 can consequently also be set independent of one another by means of the resistors 241 and 242. The optimal operating point for optimally low distortions can thereby be empirically set for real transistor pairs since pnp and npn transistors normally do not exhibit exactly the same characteristic lines.

The emitters 213, 223 are drawn to the reference potential P (in particular ground potential) for the fed radio-frequency signal S1 in that they are additionally, respectively connected with the reference potential P via a capacitor 253, 254.

If the push-pull amplifier should optimally operate with the same properties over a large temperature range, a push-pull amplifier with alternating voltage and direct voltage negative feedback is particularly suitable. Such a push-pull amplifier is shown in FIG. 2. The significant difference from the exemplary embodiment according to FIG. 1 is that the bases 212 and 222 are respectively connected with a resistor 245, 246 at the input 201 of the amplifier circuit 200 via a parallel connection 261, 262 of the capacitor 251, 252 and that the secondary coils 112, 122 of the directional coupler transformer 100 are connected in a potential-separated manner with the reference potential P and the primary coils 111, 121 are correspondingly connected in a potential-separated manner with the signal input 1 or, respectively, the signal output 2. This is achieved in that the connections of the directional coupler transformer 100 with the signal input 1 and the signal output 2 as well as the connection of the directional coupler transformer with the reference potential P via the node point 103 are respectively provided with capacitors 255, 256, 257.

In the exemplary embodiment according to FIG. 2, the resistors 241, 245, 246 and 242 also form a voltage divider. The sum of the resistance values of the resistors 245 and 246 thereby advantageously corresponds to the resistance value of the resistor 247 from FIG. 1. In particular the respective resistance value of the resistors 245 and 246 is half as large as the resistance value of the resistor value 247. If one or more of the resistors 241, 242, 243, 244, 245, 246, 247 specified in FIGS. 1 and 2 is executed as a trim resistor, an optimal quiescent current and operating point adaptation for distortions that are as small as possible is also subsequently possible.

The quiescent current through both transistors 210 and 22 is approximately equal per circuit branch for the amplifier circuit 200 shown in FIG. 2. Given well-paired transistors 210, 220, with equally large emitter resistance values the resistance value of the resistor 241 is generally to be selected equal to the resistance value of the resistor 242 so that the potential at the collectors 211 and 221 lies near the reference potential P, in particular the ground potential (0 volts). However, the resistance values of the resistors 241 and 242 can also easily be selected differently so that even given unequal transistor properties the collector potential optimally corresponds to the reference potential P (in particular the ground potential). The largest distortion free voltage rise therewith results for the signal present at the output 202 of the amplifier circuit 200.

The inventive amplifiers shown in FIG. 1 and FIG. 2 have the property of being able to transform a load impedance Z2 of, for example, 50Ω connected at the signal output 2 as an input impedance Z1 at the signal input 1. The power amplification g of the input signal S1 is determined via the winding ratios n and m in the directional coupler transformer 100. The winding ratio n is thereby associated with the input transformer 110 and provided via the ratio of the winding count b of the secondary coil 112 to the winding count a of the primary coil 111:

$$n = \frac{b}{a}$$

The winding ratio m is correspondingly associated with the output transformer 120 and provided via the ratio of the winding count d of the secondary coil 122 to the winding count c of the primary coil 121:

$$m = \frac{d}{c}$$

In general, the equation $$g = n \cdot m$$

applies for the power amplification g.

The winding ratios n and m normally correspond to one another such that the power amplification g is determined by the square of the winding ratio. However, there are also applications for the device that require a scaled reproduction of the impedance Z2 at the signal output 2 on the signal input 1. For example, if a transformational 3 dB power divider is connected at the signal output 2 which loads the signal output 2 with an impedance of Z2=25Ω and if, however, a normalized input impedance Z1 of 50Ω is required at the signal input 1, a directional coupler transformer 100 with different winding ratios m and n of the input transformer 110 and of the output transformer 120 can be used for this.

$$\rho = \frac{Z2}{Z1} = \frac{n}{m}$$

then applies for the impedance transformation ratio ρ.

Both the power amplification g and the impedance transformation ratio ρ can thus be adjusted with the two winding ratios n and m as degrees of freedom.

Thus, there is shown and described a push-pull amplifier with transformational negative feedback is provided for amplification of variable electrical signals. It includes a signal input and a signal output, a transformational negative feedback connected with the signal input and the signal output and an amplifier circuit. The amplifier circuit includes an input and an output as well as a first transistor and a second transistor. The input of the amplifier circuit is thereby connected with the signal input and the output of the amplifier circuit is thereby connected with the signal output via the transformational negative feedback.

It is advantageous when both transistors (each of which has, in a preferred embodiment, a collector, a base and an emitter) are connected on the base side with the amplifier input and on the collector side with the amplifier output. The base and the emitter of the first transistor are thereby connected with a first voltage supply connection and the base and the emitter of the second transistor are thereby connected with a second voltage supply connection. Such a connection of two transistors supplies a push-pull amplifier arrangement that is simple to realize and that operates sufficiently quickly and effectively for the intended purpose when in particular different transistor types (for example, an npn transistor and a pnp transistor) are respectively used. A voltage source that preferably supplies a voltage that is symmetrical around the reference potential in connection to the voltage supply connection of the amplifier. For example, if the reference potential is ground potential, a positive voltage of, for example, +5 V is to be applied at the first voltage supply connection and a negative voltage of, for example, −5 V is to be applied at the second voltage supply connection. The secondary coils of the directional coupler transformer therewith do not have to be supplied with a voltage for voltage supply of the amplifier circuit. The amplifier circuit is herewith directly supplied with voltage via the voltage supply connections.

It is additionally advantageous when at least one resistor is respectively provided between the base and associated voltage supply connection. It is also advantageous when at least one resistor is respectively provided between the emitter and associated voltage supply connection, whereby the emitters are respectively connected with the reference potential (in particular a ground potential) via at least one capacitor. The resistors so connected serve to advantageously fix the quiescent current for the transistors. On the emitter side, the transistors for the variable electrical signals are drawn to reference potential (in particular a ground potential) via the capacitors.

At least one adjustable resistor, in particular a trim resistor, is thereby advantageously provided. For example, if the performance characteristics of both transistors do not correspond to one another, the quiescent currents can also be subsequently adapted by means of the at least one adjustable resistor. The optimal operating point for least possible distortions can thus be selected.

It is advantageous when at least one capacitor is respectively provided between the base of each transistor and the input of the amplifier circuit and both bases are connected with one another via at least one resistor. The variable electrical signal can herewith be directly forwarded to both bases and an alternating voltage negative feedback can be realized via the directional coupler transformer. Concerning the direct voltage-related operating point of the transistors, both collectors thereby lie at the reference potential (in particular the ground potential) via the secondary coil.

It is also advantageous when a parallel circuit made up of at least one capacitor and at least one resistor is respectively provided between the base of each transistor and the input of the amplifier circuit. Furthermore, at least one capacitor is respectively provided between the primary coil of the input transformer and the signal input, between the primary coil of the output transformer and the signal output and between the secondary coils and the reference potential. In addition to the alternating voltage negative feedback, a direct voltage negative feedback can also herewith be realized via the directional coupler transformer. This is particularly advantageous when the amplifier should operate over a very large temperature range with optimally identical properties. The resistor values of both resistors of both parallel circuits should thereby be selected such that the quiescent current through both transistors is essentially equal. Both collectors thereby rest at reference potential (in particular ground potential).

The push-pull amplifier is advantageously designed for frequencies of 10 kHz and higher, in particular up to 10 GHz. The variable electrical signal is advantageously a radio-frequency signal. The frequency range thereby extends from 10 kHz to 10 GHz.

It is advantageous when the first transistor is a pnp transistor and the second transistor is a npn transistor. Balancing means (such as, for example, balancing transformers) that normally do not exhibit low distortion and which are moreover costly and voluminous can thus be omitted.

Both transistors are particularly advantageously executed as a complementary pnp and npn transistor pair. For example, the adaptation of the quiescent current of both transistors is simplified by the complementary embodiment. In the ideal case, the resistance values of the quiescent current-influencing resistors in the amplifier circuit can thereby be selected equally large for both transistors. Moreover, due to the complementary embodiment the amplifier exhibits a high operating range.

The input transformer and/or the output transformer of the directional coupler transformer are/is advantageously, respectively executed with an toroidal core that enables a good magnetic coupling of the primary winding and secondary winding with simultaneously low capacitive coupling.

It is also advantageous when the input transformer and the output transformer of the directional coupler transformer are executed with a common double core that enables a good magnetic coupling of the primary and secondary coils with simultaneously low capacitive coupling. The arrangement of the input transformer and the output transformer on a common core also provides a space savings.

The winding ratio n of the input transformer advantageously corresponds to the winding ratio m of the output transformer. The winding ratio n is thereby provided by the ratio of the winding count of the secondary coil and primary coil of the input transformer and the winding ratio m is provided by the ratio of the winding count of the secondary coil and primary coil of the output transformer. If the winding counts of the secondary coils are thereby respectively greater than the corresponding winding counts of the primary coils, the power fed to the signal input is output amplified at the signal output by the directional coupler transformer. The magnitude of the power amplifier is thereby provided by the square of the winding ratio of secondary coil to primary coil of the direct voltage transformer.

It is also advantageous when the winding ratio n of the input transformer differs from the winding ratio m of the output transformer. If the winding counts of the secondary coils are thereby respectively greater than the corresponding winding counts of the primary coils, the power fed to the signal input is output at the signal output amplified by the directional coupler transformer. The magnitude of the power amplifier is thereby provided by the product of the individual winding ratio of the secondary coil to the primary coil of the direct voltage transformer. With the consideration of different winding ratios in the directional coupler transformer, a further degree of freedom is provided to adapt the input impedance of the inventive push-pull amplifier with regard to its output impedance.

The push-pull amplifier is advantageously provided as a part of an RF amplifier electronic of a magnetic resonance imaging system. MR imaging systems directly depend on an optimally distortion-free amplification of RF signals (in particular of image signals) over a relatively large bandwidth of, for example, 15 MHz to 300 MHz, which distortion-free amplification is offered by the inventive push-pull amplifier. Moreover, for a use in MR imaging systems the inventive push-pull amplifier advantageously distinguishes itself in that it can in particular be designed as energy- and space-saving.

Although other modifications and changes may be suggested by those skilled in the art, it is the intention of the inventors to embody within the patent warranted hereon all changes and modifications as reasonably and properly come within the scope of their contribution to the art.

I claim:

1. A push-pull amplifier with transformational negative feedback for amplification of variable electrical signals, comprising:
    a signal input and a signal output;
    a transformational negative feedback connected with said signal input and said signal output;
    an amplifier circuit comprising an input and an output as well as a first transistor and a second transistor, said input of said amplifier circuit being connected with said signal input, and said output of said amplifier circuit being connected with said signal output via the transformational negative feedback;
    said transformational negative feedback is a directional coupler transformer which comprises an input transformer and an output transformer with a respective primary coil and a secondary coil;
    said input of said amplifier circuit is being connected with said signal input via said primary coil of the input transformer and said input of said amplifier circuit being connected with a reference potential via said secondary coil of said output transformer, at least for the variable electrical signal to be amplified; and
    said output of the said amplifier circuit being connected with said signal output via said primary coil of said output transformer and said output of said amplifier circuit being connected with said reference transformer potential via said secondary coil of the input transformer, at least for the variable electrical signal to be amplified.

2. A push-pull amplifier according to claim 1, wherein said amplifier operates at frequencies of 10 kHz and higher.

3. A push-pull amplifier according to claim 1, wherein the variable electrical signal is a radio-frequency signal.

4. A push-pull amplifier according to claim 1, wherein said first transistor is a pnp transistor and said second transistor is an npn transistor.

5. A push-pull amplifier according to claim 1, wherein said first and second transistors are a complementary pnp and npn transistor pair.

6. A push-pull amplifier according to claim 1, wherein at least one of said input transformer and said output transformer of the directional coupler transformer has an annular core.

7. A push-pull amplifier according to claim 1, wherein said input transformer and said output transformer of the directional coupler transformer include a common double gap core.

8. A push-pull amplifier according to claim 1, wherein a winding ratio n of said input transformer corresponds to a winding ratio m of said output transformer.

9. A push-pull amplifier according to claim 1, wherein a winding ratio n of said input transformer differs from a winding ratio m of said output transformer.

10. A push-pull amplifier with transformational negative feedback for amplification of variable electrical signals, comprising:
    a signal input and a signal output;
    a transformational negative feedback connected with said signal input and said signal output;
    an amplifier circuit comprising an input and an output as well as a first transistor and a second transistor, said input of said amplifier circuit being connected with said signal input, and said output of said amplifier circuit being connected with said signal output via the transformational negative feedback;
    both said first and second transistors respectively comprise a collector, a base and an emitter and are connected at the base with said amplifier input and at the collector with said amplifier output, the base and the emitter of the first transistor being connected with a first voltage supply connection and the base and the emitter of said second transistor being connected with a second voltage supply connection.

11. A push-pull amplifier according to claim 10, further comprising: at least one resistor respectively provided between the base and associated voltage supply connection.

12. A push-pull amplifier according to claim 11, further comprising: at least one adjustable resistor.

13. A push-pull amplifier according to claim 10, further comprising: at least one resistor respectively provided between the emitter and associated voltage supply connections, the emitters being respectively connected with the reference potential via at least one capacitor.

14. A push-pull amplifier according to claim 10, further comprising: at least one capacitor respectively provided between the base of each of said first and second transistors and said input of the amplifier circuit and both of the bases are connected with one another via a resistor.

15. A push-pull amplifier according to claim 10, further comprising:
- a parallel circuit made up of at least one capacitor and at least one resistor respectively provided between the base of each of said first and second transistors and said input of said amplifier circuit;
- at least one capacitor provided between said primary coil of the input transformer and said signal input;
- at least one capacitor provided between said primary coil of the output transformer and said signal output; and
- at least one capacitor provided between said secondary coils and the reference potential.

16. A push-pull amplifier with transformational negative feedback for amplification of variable electrical signals, comprising:
- a signal input and a signal output;
- a transformational negative feedback connected with said signal input and said signal output; and
- an amplifier circuit comprising an input and an output as well as a first transistor and a second transistor, said input of said amplifier circuit being connected with said signal input, and said output of said amplifier circuit being connected with said signal output via the transformational negative feedback, wherein said amplifier is connected in an RF amplifier electronic of a magnetic resonance imaging system.

* * * * *